(12) United States Patent
Yao et al.

(10) Patent No.: US 7,303,811 B2
(45) Date of Patent: Dec. 4, 2007

(54) POROUS INSULATING FILM AND ITS LAMINATES

(75) Inventors: Shigeru Yao, Ichihara (JP); Yukihiko Asano, Ichihara (JP); Shyusei Ohya, Ichihara (JP); Kenji Fukunaga, Ichihara (JP); Masayuki Kinouchi, Ube (JP); Kenji Kawabata, Ube (JP)

(73) Assignee: Ube Industries, Yamaguchi (JP)

( * ) Notice: Subject to any disclaimer, the term of this patent is extended or adjusted under 35 U.S.C. 154(b) by 0 days.

(21) Appl. No.: 10/785,413

(22) Filed: Feb. 25, 2004

(65) Prior Publication Data

US 2004/0166297 A1 Aug. 26, 2004

Related U.S. Application Data

(63) Continuation of application No. 09/539,929, filed on Mar. 31, 2000, now abandoned.

(30) Foreign Application Priority Data

| Apr. 23, 1999 | (JP) | ................................. | 11-116178 |
| May 13, 1999 | (JP) | ................................. | 11-132755 |
| Nov. 29, 1999 | (JP) | ................................. | 11-337445 |

(51) Int. Cl.
*B32B 3/26* (2006.01)
(52) U.S. Cl. ............................. 428/315.7; 428/315.5; 428/901; 428/473.5
(58) Field of Classification Search ............ 428/315.5, 428/315.7, 901, 473.5
See application file for complete search history.

(56) References Cited

U.S. PATENT DOCUMENTS

| 4,450,198 | A | 5/1984 | Michaels | ................. | 428/315.5 |
| 4,474,662 | A | 10/1984 | Makino et al. | ........ | 210/500.39 |
| 4,613,544 | A | 9/1986 | Burleigh | .................. | 428/315.5 |
| 4,824,743 | A | 4/1989 | Fujii et al. | ................... | 429/101 |
| 5,510,395 | A | 4/1996 | Tomioka et al. | ............ | 521/184 |
| 5,547,833 | A * | 8/1996 | Dorval et al. | .................. | 435/5 |
| 6,090,081 | A | 7/2000 | Sudo et al. | ................. | 604/230 |
| 6,115,514 | A | 9/2000 | Ando et al. | .................... | 385/11 |
| 6,187,248 | B1 * | 2/2001 | O'Neill et al. | .............. | 264/425 |

FOREIGN PATENT DOCUMENTS

| GB | 2101137 A | 4/1992 |
| JP | 2-2856 | 1/1990 |
| JP | 3-166930 | 7/1991 |
| JP | 9-100363 | 4/1997 |

OTHER PUBLICATIONS

Complete Translation of JP 02-2856, "Porous Membrane", Ito et al, Jan. 8, 1990, 16 pages.*
Saunders et al, the article "Microporous Polyimide Films for Reduced Dielectric Applications", SAND94-2831, Aug. 1996, 13 pages.*
Patent Abstract of Japanese Application No. 01305812.
Patent Abstract of Japanese Application No. 07259039.

* cited by examiner

*Primary Examiner*—Hai Vo
(74) *Attorney, Agent, or Firm*—Morgan, Lewis & Bockius LLP

(57) ABSTRACT

A porous insulating film comprising a highly heat resistant resin film having a fine porous structure with a mean pore size of 0.01-5 μm in at least the center of the film, and a porosity of 15-80%. A laminate is prepared by forming a heat resistant adhesive layer or a conductive metal layer or an inorganic or metal substrate on one or both sides of the porous insulating film or by forming an inorganic or metal substrate on one side of the porous insulating film and a conductive metal layer on the other side.

12 Claims, 8 Drawing Sheets

POROUS INSULATING FILM AND ITS LAMINATES

This is a continuation application of U.S. application Ser. No. 09/539,929 (filed Mar. 31, 2000) now abandoned, which claims the benefit of Japanese Patent Application No. 11-116178 (filed Apr. 23, 1999), Japanese Patent Application No. 11-132755 (filed May 13, 1999), and Japanese Patent Application No. 11-337445 (filed Nov. 29, 1999) all of which are herein incorporated by reference in their entirety.

BACKGROUND OF THE INVENTION

1. Field of the Invention

The present invention relates to a porous insulating material and its laminates, that exhibit excellent electrical properties (low dielectric constant) and heat resistance, and particularly it relates to a porous insulating material and its laminates that are resistant to dielectric deterioration by dielectric breakdown or the like and are strongly adhesive or adhesive, and that are highly useful for high-frequency electronic parts, and especially distribution substrates.

Throughout the present specification, "insulating film" will refer to an electrical insulating film. "Fine continuous pores" will refer to fine pores that form continuous channels from one side to another, where the fine pores preferably run in a nonlinear fashion from one side to the other on a nonlinear path.

2. Description of the Related Art

With the rapid increase. in communication data in recent years there has been an increasing desire for miniaturization, weight reduction and higher speeds for communication devices, which has led to a demand for suitable low-dielectric constant electrical insulating materials. In particular, the frequency band ranges of the waves used for portable mobile communications such as automobile phones, digital cellular phones and satellite communications are the high-frequency bands in the MHz and GHz ranges. In the rapid development of communication devices used as the means for such communication, designs have been produced for mounting small high-density boards, substrates and electronic elements. For miniaturization and weight reduction of communication devices suited for high-frequency ranges such as the MHz to GHz bands, it is necessary to develop electric insulating materials having both excellent high-frequency propagation characteristics and appropriate low dielectric constant characteristics.

Specifically, energy loss occurs in circuit elements during the course of propagation, and is known as dielectric loss. This energy loss is undesirable because it is expended as heat energy in the circuit element and is released as heat. The energy loss is produced in low frequency ranges by variation in the electric field of the dipole created by dielectric polarization, and is produced in high frequency ranges by ionic polarization and electronic polarization. The ratio of the energy expended in a dielectric material and the energy stored in the dielectric material in one cycle of an alternating electric field is called the dielectric loss tangent, and it is represented by $\tan\delta$. The dielectric loss is proportional to the product of the dielectric constant $\epsilon$ and the dielectric loss tangent of the material. Thus, a total energy loss due to $\tan\delta$ is increased in the higher frequency range. Also, since the heat release per unit area is larger when mounting high-density electronic elements, a material with a small $\tan\delta$ must be used to suppress dielectric loss of the insulating material. By using a low dielectric polymer material with low dielectric loss, the heat release due to dielectric loss and electrical resistance is controlled, thus helping to reduce signal malfunction; materials with low transmission loss (energy loss) are therefore in great demand in the field of high frequency communications.

Various materials having such electrical properties including electrical resistance characteristics and low dielectric constant have been proposed, among which are thermoplastic resins such as polyolefins, vinyl chloride resins and fluorine-based resins, and thermosetting resins such as unsaturated polyester resins, polyimide resins, epoxy resins, vinyltriazine resins (VT resins), crosslinked polyphenylene oxide, curable polyphenylene ethers, and the like.

Polymers containing fluorine atoms in the molecular chain, such as vinylidene fluoride resins, trifluoroethylene resins and perfluoroethylene resins, have excellent electrical characteristics (low dielectric constant, low dielectric loss), heat resistance and chemical stability, but unlike thermoplastic resins they are poorly suited for shape forming and coat forming to obtain molds or films through heat treatment, and they increase costs when used for device manufacture. In addition, their low transparency is a drawback that limits the range of applicable fields. Since the above-mentioned low dielectric constant general use polymer materials all have allowable maximum temperatures of below 130° C., as electrical instrument insulating materials their heat resistance classification is type B or below as specified by JIS-C4003, and therefore their heat resistance is inadequate.

As resins with relatively good heat resistance there may be mentioned thermosetting resins such as epoxy resins, polyphenylene ether (PPE), unsaturated polyester resins and phenol resins. However, none of these exhibit a satisfactory level of heat resistance and dielectric constant.

Further performance demanded for low dielectric constant materials with excellent dielectric/insulating resistance characteristics often includes a requirement for soldering resistance that can withstand heating at 260° C. or above for at least 120 seconds because of the soldering step in the device manufacturing process.

BRIEF SUMMARY OF THE INVENTION

It is an object of the present invention to provide a porous insulating material with heat resistance, low dielectric constant and dielectric loss and excellent insulating properties, as well as laminates thereof.

The present invention relates to a porous insulating film comprising a highly heat resistant resin film having a fine porous structure with a mean pore size of 0.01-5 μm in at least the center of the film, and having a porosity of 15-80%.

The invention further relates to a laminate prepared by laminating a heat resistant adhesive layer on one or both sides of the aforementioned porous insulating material.

The invention still further relates to a laminate prepared by laminating a conductive metal layer for an electronic circuit on one or both sides of the aforementioned porous insulating material, either directly or via a heat resistant adhesive layer.

The invention yet further relates to a laminate prepared by laminating an inorganic or metal substrate onto one or both sides of the aforementioned porous insulating film and a conductive metal layer onto the other side, each via a heat resistant adhesive layer.

BRIEF DESCRIPTION OF THE SEVERAL VIEWS OF THE DRAWING

In FIGS. 1-6, 1 is a porous polyimide film as a porous insulating material, 2 represents continuous pores, 3 is a highly heat resistant resin, 4 is a dense layer, 5 is an inorganic, organic or metal substrate, such as a silicon substrate, 6 is a heat resistant adhesive, 7 is a conductive metal. circuit layer, 10 is a laminate and 11 is another laminated porous polyimide layer as a porous insulating material.

DETAILED DESCRIPTION OF THE INVENTION

The embodiments of the invention are as follows.

1) The aforementioned porous insulating film wherein the fine porous structure comprises fine continuous pores.

2) The aforementioned porous insulating film which is fabricated by film casting.

3) The aforementioned porous insulating film which has a dielectric constant of no greater than 2.5.

4) The aforementioned porous insulating film wherein the highly heat resistant resin film is a polyimide film.

5) The aforementioned porous insulating film wherein the porous structure contains fine continuous pores reaching to both surfaces.

6) The aforementioned porous insulating film wherein the porous structure includes a dense layer on both surfaces of the film.

7) The aforementioned porous insulating film which has a porosity of 30-80%, a maximum pore size of no greater than 10 µm, a film thickness of 5-100 µm, a resistance to passage of air of from 30 sec/100 cc to 2000 sec/100 cc, a heat resistance temperature of 200° C. or above and a heat shrinkage of no greater than ±1%, and which has fine continuous pores reaching to both surfaces.

The highly heat resistant resin according to the invention may be a resin made of a high molecular weight and highly heat resistant polymer produced by condensation polymerization and heating of an acid component and a diamine component, and it is preferably an aromatic polyimide.

The following explanation will deal with a case using an aromatic polyimide as the highly heat resistant resin.

The present invention will now be explained with reference to the attached drawings.

Figure 1:
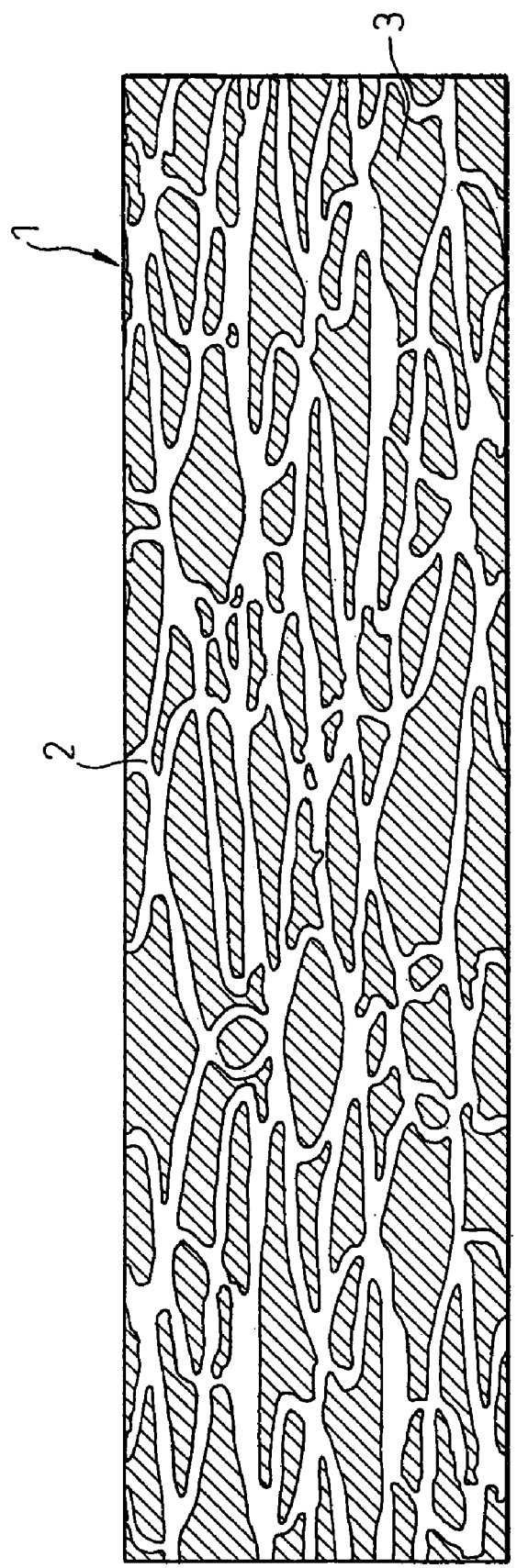
FIG. 1 is an enlarged cross-sectional schematic drawing of a porous polyimide film as a porous insulating material according to an embodiment of the invention.

FIG. 1 is an enlarged cross-sectional schematic drawing of a porous polyimide film as a porous insulating film (hereunder also referred to as "porous insulating material") according to an embodiment of the invention.

Figure 2:
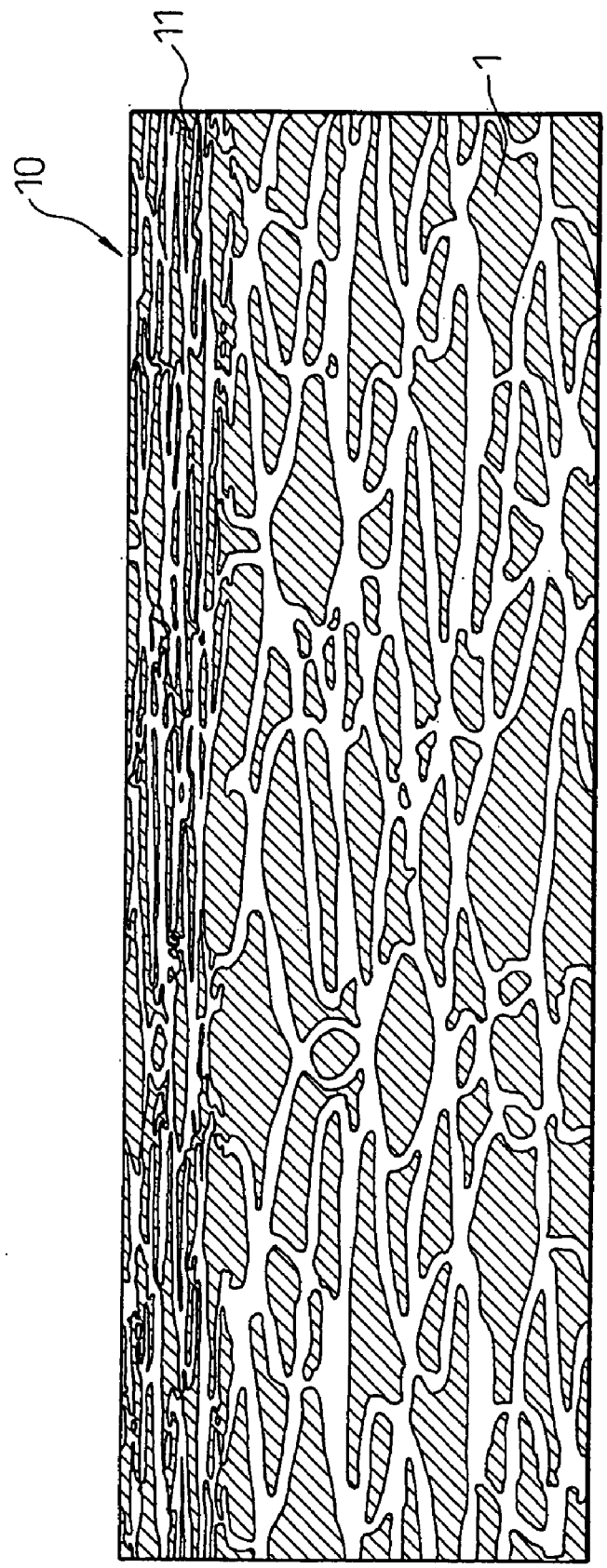
FIG. 2 is an enlarged cross-sectional schematic drawing of a laminate formed by laminating two layers of a porous polyimide film as a porous insulating material according to an embodiment of the invention.

FIG. 2 is an enlarged cross-sectional schematic drawing of a laminate (substrate) formed by laminating two layers of a porous polyimide film as a porous insulating film according to an embodiment of the invention.

Figure 3:
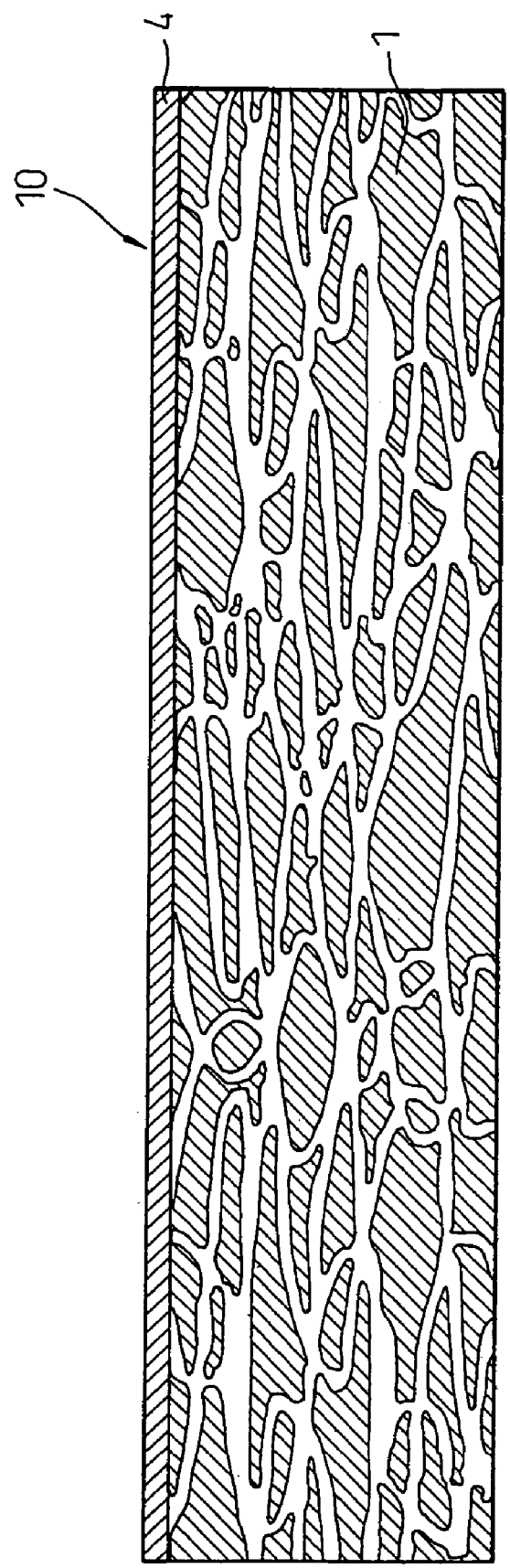
FIG. 3 is an enlarged cross-sectional schematic drawing of a one side-densified porous polyimide film according to an embodiment of the invention.

FIG. 3 is an enlarged cross-sectional schematic drawing of a porous polyimide film with a dense layer on one side according to an embodiment of the invention.

Figure 4:
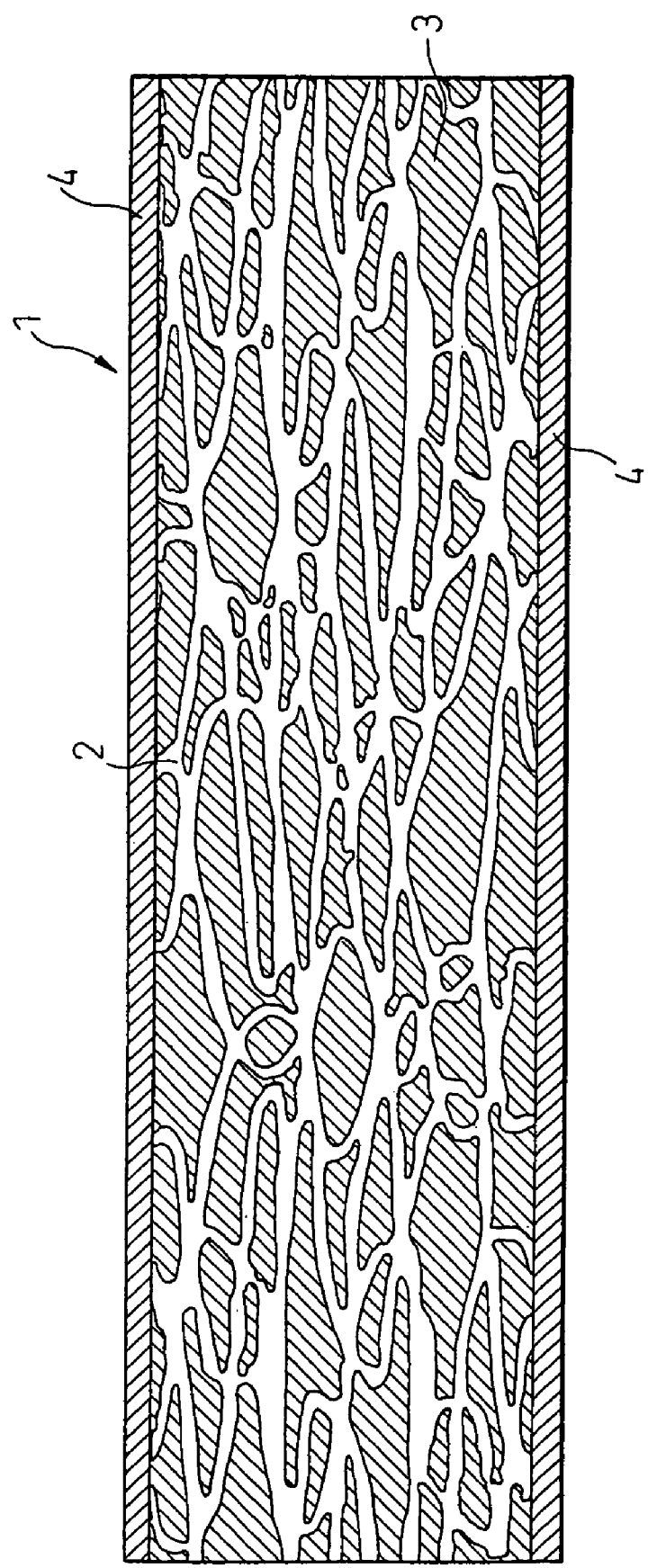
FIG. 4 is an enlarged cross-sectional schematic drawing of a both side-densified porous polyimide film according to an embodiment of the invention.

FIG. 4 is an enlarged cross-sectional schematic drawing of a porous polyimide film with a dense layer on each side according to an embodiment of the invention.

Figure 5:
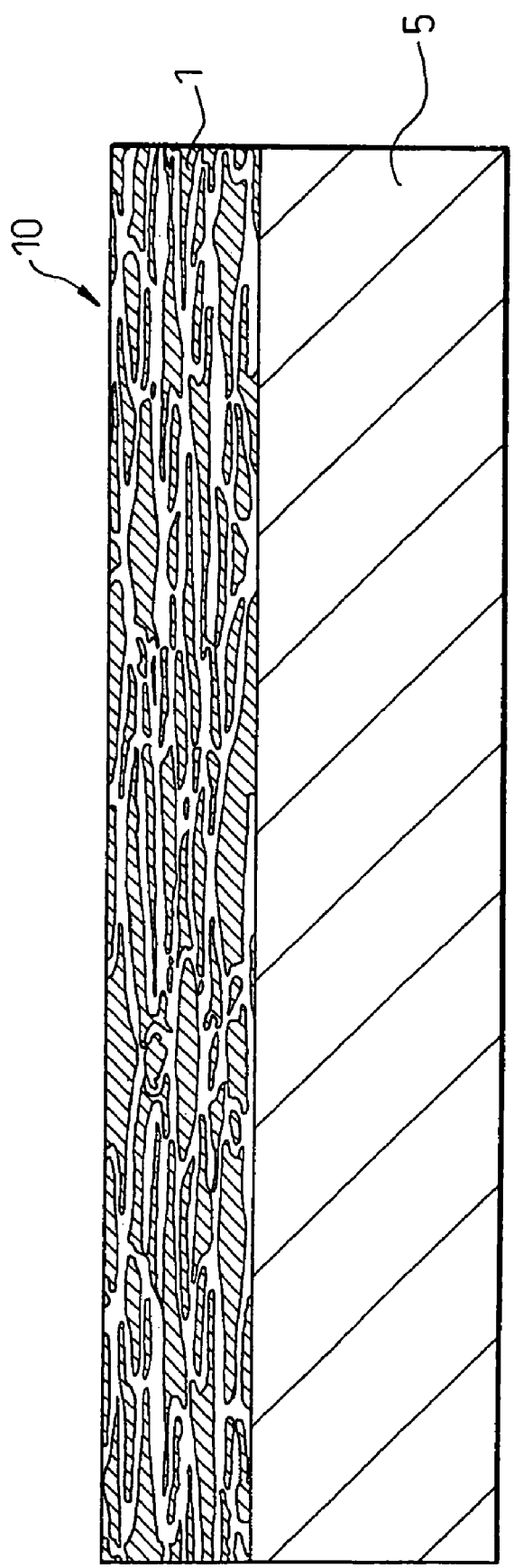
FIG. 5 is an enlarged cross-sectional schematic drawing of a laminate formed by laminating a porous polyimide film as a porous insulating material on an inorganic, organic or metal substrate, according to an embodiment of the invention.

FIG. 5 is an enlarged cross-sectional schematic drawing of a laminate (substrate) formed by laminating a porous polyimide film as a porous insulating film on a silicon substrate, according to an embodiment of the invention.

Figure 6:
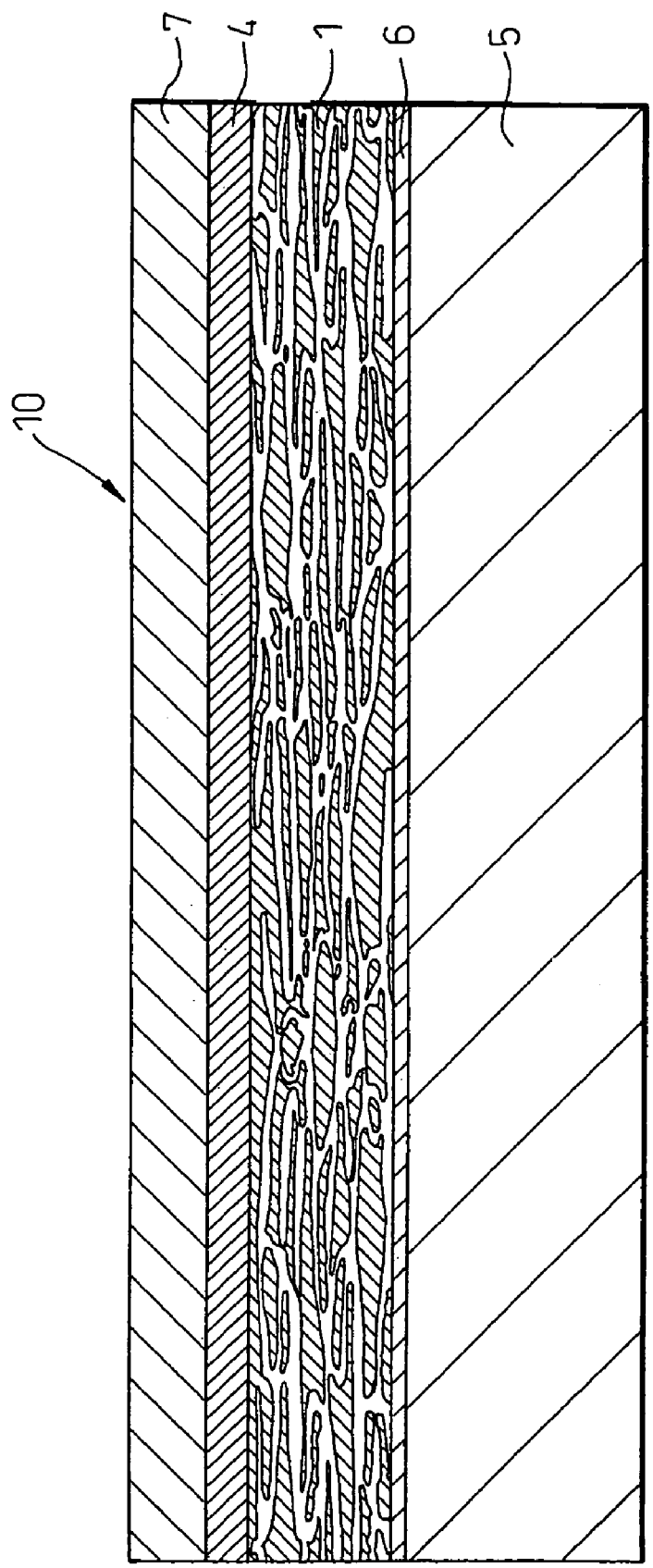
FIG. 6 is an enlarged cross-sectional schematic drawing of a laminate wherein an inorganic, organic or metal substrate such as a silicon substrate is formed on one side of a porous polyimide film as a porous insulating material according to an embodiment of the invention via a heat resistant adhesive, while a dense polyimide layer, and additionally a conductive metal circuit layer, are formed on the other side.

FIG. 6 is an enlarged cross-sectional schematic drawing of a laminate wherein an inorganic, organic or metal substrate such as a silicon substrate is formed on one side of a porous polyimide film as a porous insulating material according to an embodiment of the invention via a heat resistant adhesive, while a dense polyimide layer, and additionally a conductive metal circuit layer, are formed on the other side.

The formation of more than two different substrates in FIGS. 2 to 5 can be accomplished, for example, by laminating a precursor porous film on a substrate of the same or a different type by applying pressure if necessary, and then heating and drying it.

The porous polyimide film used as a representative example of a porous insulating material of the invention may be fabricated, for example, by any of the following three film casting methods. Film casting can give porous insulating films suitable as porous electric insulating materials having uniform pore sizes and satisfactory surface smoothness even with thin film thicknesses.

As a first method, there may be mentioned a method in which a polyimide precursor solution comprising 0.3-60 wt % of a polyimide precursor and 99.7-40 wt % of a solvent is cast into a film and contacted with a solidifying solvent with a solvent substitution rate adjustor to precipitate the porous polyimide precursor, and then the pore-formed polyimide precursor film with fine continuous pores reaching to both surfaces is subjected to thermal imidation or chemical imidation to obtain a porous polyimide film.

As a second method, there may be mentioned a method in which a polyimide precursor solution comprising (A) a homogeneous solution of a polyimide precursor and (B) a poor solvent for the polyimide precursor is cast into a film and the film-like composition is heat treated for imidation to obtain a porous polyimide film having a dense layer, preferably of a thickness of 0.2-5 μm, on both sides of the film and a fine porous layer at the center of the film.

As a third method, there may be mentioned a method in which a polyimide precursor solution comprising 0.3-60 wt % of a polyimide precursor and 99.7-40 wt % of a solvent is cast into a film and subjected to treatment by exposure to vapor of a non-solvent for the polyimide precursor, after which it is contacted with a solidifying solvent to form pores and then the porous polyimide precursor film with fine continuous pores reaching to both surfaces is subjected to thermal imidation or chemical imidation to obtain a porous polyimide film.

The polyimide precursor is a polyamic acid or a partially imidated form thereof, obtained by polymerization of a tetracarboxylic acid component and a diamine component, preferably an aromatic monomer, and it may be made into a polyimide resin with ring closure by thermal imidation or chemical imidation. The polyimide resin is a heat resistant polymer wherein the imidation rate explained hereunder is about 80% or greater, and preferably about 95% or greater.

The organic solvent (good solvent) used as the solvent for the polyimide precursor may be parachlorophenol, N-methyl-2-pyrrolidone (NMP), pyridine, N,N-dimethylacetamide, N,N-dimethylformamide, dimethylsulfoxide, tetramethylurea, phenol, cresol, or the like.

The tetracarboxylic acid component and the aromatic diamine component is dissolved in the above-mentioned organic solvent in roughly equimolar amounts for polymerization, producing a polyimide precursor with an inherent viscosity (30° C., concentration: 0.5 g/100 mL NMP) of at least 0.3, and especially 0.5-7. When the polymerization is carried out at a temperature of about 80° C. or above, a polyimide precursor is produced which is imidated by partial ring closure.

The aromatic diamine is preferably an aromatic diamine compound represented, for example, by general formula (1),

$$H_2N-R(R^1)_m-A-(R^2)_nR'-NH_2 \quad (1)$$

where R and R' are direct bonds or divalent aromatic rings and at least one is a divalent aromatic ring, $R^1$ and $R^2$ are substituents such as hydrogen, lower alkyl, lower alkoxy, halogen, etc., A is a direct bond or a divalent group such as O, S, CO, $SO_2$, SO, $CH_2$, $C(CH_3)_2$, etc. and m and n are integers of 1-4.

As specific aromatic diamine compounds there may be mentioned 4,4'-diaminodiphenylether (hereunder abbreviated as DADE), 3,3'-dimethyl-4,4'-diaminodiphenylether, 3,3'-diethoxy-4,4'-diaminodiphenylether and paraphenylenediamine (hereunder abbreviated as p-PDA), with 4,4'-diaminodiphenylether and paraphenylenediamine being preferred.

The aromatic diamine component may also be a diaminopyridine, and specifically there may be mentioned 2,6-diaminopyridine, 3,6-diaminopyridine, 2,5-diaminopyridine and 3,4-diaminopyridine.

The aromatic diamine component may also comprise two or more of the aforementioned aromatic diamines in combination.

The tetracarboxylic acid component is preferably a biphenyltetracarboxylic acid component, with preferred examples including 3,3',4,4'-biphenyltetracarboxylic dianhydride (hereunder also abbreviated as s-BPDA) and 2,3,3',4'-biphenyltetracarboxylic dianhydride (hereunder also abbreviated as a-BPDA), but it may also be 2,3,3',4'- or 3,3',4,4'-biphenyltetracarboxylic acid or a 2,3,3',4'- or 3,3',4,4'-biphenyltetracarboxylic acid salt or esterified derivative. The biphenyltetracarboxylic acid component may also comprise a mixture of the aforementioned biphenyltetracarboxylic acids.

As other tetracarboxylic acid components there may be mentioned tetracarboxylic acids such as pyromellitic acid, 3,3',4,4'-benzophenonetetracarboxylic acid, 2,2-bis(3,4-dicarboxyphenyl)propane, bis(3,4-dicarboxyphenyl)sulfone, bis(3,4-dicarboxyphenyl)ether, bis(3,4-dicarboxyphenyl)thioether and their acid anhydride, salt or ester derivatives. A portion of these aromatic tetracarboxylic acid components may also be replaced with an aliphatic tetracarboxylic acid such as butanetetracarboxylic acid or an anhydride, salt or ester derivative thereof in a proportion of no more than 10 molar percent and especially no more than 5 molar percent with respect to the total tetracarboxylic acid component.

Particularly preferred as tetracarboxylic acid components are 3,3',4,4'-biphenyltetracarboxylic dianhydride, pyromellitic dianhydride and 3,3',4,4'-benzophenonetetracarboxylic dianhydride.

In the first method described above as an example for fabrication of a porous insulating film, a polyimide precursor solution is prepared by dissolving the polyimide precursor in the organic solvent to a polyimide precursor proportion of 0.3-60 wt %, and preferably 1-30 wt % in the solution (the organic solvent may also be added or the polymer solution itself may be used). If the polyimide precursor proportion is less than 0.3 wt % the film strength of the fabricated porous film may be reduced. If it is greater than 60 wt %, the permeability of the porous film may be lower, and therefore the range given above is preferred. The solution viscosity of the prepared polyimide precursor solution is 10-10,000 poise, and preferably 40-3000 poise. If the solution viscosity is less than 10 poise the film strength of the fabricated porous film may be reduced, and if it is higher than 10,000 poise casting into a film may be more difficult, and therefore the ranges given above are preferred.

After the polyimide precursor solution has been cast into a cast film, it is made into a laminated film by laying a solvent substitution rate adjustor on at least one side thereof. The method of obtaining the cast laminated film of the polyimide precursor solution is not particularly restricted, and various techniques may be employed, including a method in which the polyimide precursor solution is cast onto a plate of glass or the like serving as the base or onto a movable belt and the cast surface is covered with a solvent substitution rate adjustor; a method in which a spray or doctor blade method is used to thinly coat the polyimide precursor solution onto a solvent substitution rate adjustor; and a method in which the polyimide precursor solution is extruded from a T-die and filled between solvent substitution rate adjustors, to obtain a 3-layer laminated film with the solvent substitution rate adjustor on both sides thereof.

The solvent substitution rate adjustor is preferably one with permeability of a level that allows the polyimide precursor solvent and the solidifying solvent to permeate at a suitable rate when the multilayer film contacts with the solidifying solvent to precipitate the polyimide precursor. In particular, the gas permeability is preferably 50-1000 sec/100 cc, and especially 250-800 sec/100 cc. The film thickness of the solvent substitution rate adjustor is 5-500 μm and preferably 10-100 μm, and pores of 0.01-10 μm, and preferably 0.03-1 μm, penetrating in the cross-sectional direction of the film are preferably distributed at a sufficient density. If the film thickness of the solvent substitution rate adjustor is lower than the above range the solvent substitution rate may be too fast, which is unsuitable since wrinkles may be produced when it contacts with the solidifying solvent, and if it is higher than the above range the solvent substitution rate may be too slow, thus resulting in a non-uniform pore structure formed inside the polyimide precursor.

The solvent substitution rate adjustor used may be, specifically, a nonwoven fabric or porous film made from a material of a polyolefin such as polyethylene, polypropylene or the like, and the use of a polyolefin fine porous film is particularly preferred for excellent smoothness of the surface of the fabricated polyimide porous film.

The multilayered polyimide precursor cast product is contacted with the solidifying solvent through the solvent substitution rate adjustor, for precipitation of and pore formation in the polyimide precursor. The solidifying solvent used for the polyimide precursor may be a non-solvent for the polyimide precursor, for example, an alcohol such as ethanol or methanol, or acetone, water or the like, or a mixture of 99.9-50 wt % of a non-solvent and 0.1-50 wt % of a solvent for the polyimide precursor. There are no particular restrictions on the combination for a non-solvent and solvent, but it is preferably one that gives a uniform porous structure for the precipitated polyimide precursor when the mixture comprising the non-solvent and solvent is used as the solidifying solvent.

In the second method described above as an example for fabrication of a porous insulating film with dense layers on both sides, the film-like composition (C) comprises a homogeneous solution of the polyimide precursor (A) which is a solution preferably comprising 0.3-60 wt % and especially 1-30 wt % of the polyimide precursor and 99.7-40 wt % and especially 99-70 wt % of a good solvent for the polyimide precursor, and a poor solvent (B) for the polyimide precursor, which is a poor solvent having a boiling point or thermal decomposition temperature at a temperature higher than or equal to the imidation initiation temperature of the polyimide precursor (usually about 170° C.), wherein the poor solvent used is a compound having a boiling point or thermal decomposition temperature higher than or equal to the imidation initiation temperature of the polyimide precursor, in order to obtain a film-like composition.

The poor solvent (B) is preferably a poor solvent having a higher boiling point than the good solvent for the polyimide precursor in the homogeneous solution (A) of the polyimide precursor. Specifically, it is a poor solvent with a boiling point or thermal decomposition temperature of 150-500° C., and preferably a boiling point or decomposition temperature of 170-300° C.

As the poor solvent (B) there may be mentioned cyclic ethers with boiling points of 100° C. and below.

The poor solvent (B) for the polyimide precursor is preferably one that is removed from the film composition (C) by evaporation or thermal decomposition in the step of proceeding heat imidation of the polyimide precursor. If the poor solvent (B) is not removed from the film-like composition (C) in the step of proceeding heat imidation, the resulting porous film may not be suitable for the field of electronic materials.

As poor solvents (B) that satisfy these conditions there may be mentioned linear monohydric alcohols with 7 or more aliphatic carbon atoms, dihydric alcohols with 7 or more carbon atoms, branched alcohols, cyclic alcohols, alicyclic alcohols, aromatic alcohols and other high-boiling-point alcohols.

As specific examples there may be mentioned n-heptanol (boiling point: 176.3° C.), n-octanol (boiling point: 179.3° C.), n-nonanol (boiling point: 203° C.), n-decanol (boiling point: 231° C.), n-undecanol (boiling point: 243° C.), 2-octanol (boiling point: 179° C.), 2-ethylhexanol (boiling point: 184.7° C.), 2,6-dimethyl-4-heptanol (boiling point: 178° C.), 3,5,5-trimethyl-1-hexanol (boiling point: 194° C.), tetrahydrofurfuryl alcohol (boiling point: 178° C.), λ-terpineol (boiling point: 219° C.), furfuryl alcohol (boiling point: 170° C.) and benzyl alcohol (boiling point: 205.8° C.). Particularly preferred for use is n-decanol.

For ether systems, the poor solvent (B) may be methylanisole (boiling point: 171-177° C.), ethyl benzyl ether (boiling point: 186° C.), diisoamyl ether (boiling point: 173.2° C.), 1,8-cineole (boiling point: 176.4° C.), phenetole (boiling point: 170.3° C.), butyl phenyl ether (boiling point: 210.2° C.) or the like.

For polyhydric alcohols and their derivatives, the poor solvent (B) may be ethyleneglycol (boiling point: 197° C.), dipropyleneglycol (boiling point: 231.8° C.), dipropyleneglycol monoethylether (boiling point: 198° C.), dipropyleneglycol monobutylether (boiling point: 231° C.), triethyleneglycol dimethylether (boiling point: 216° C.), trimethyleneglycol (boiling point: 213° C.), hexyleneglycol (boiling point: 213° C.) or the like.

Particularly preferred for use is ethyleneglycol.

As cyclic ethers with boiling points below 100° C. that are suitable as the poor solvent (B) there may be mentioned oxetane (boiling point: 48° C.), tetrahydrofuran (boiling point: 66° C.) and tetrahydropyrane (boiling point 88° C.).

The film-like composition (C) comprising the homogeneous solution (A) of the polyimide precursor and the poor solvent (B) for the polyimide precursor can be obtained by using either of the following methods, method (a) or method (b).

For method (a), the poor solvent (B) may be added at 10-40 parts by weight and especially 15-30 parts by weight to 100 parts by weight of the homogeneous solution (A) of the polyimide precursor to prepare a uniform mixed solution, and the mixed solution cast onto a substrate to obtain a film-like composition (C).

In this method, if the amount of the poor solvent (B) with respect to 100 parts by weight of the homogeneous solution (A) is less than 10 parts by weight the effect of adding the poor solvent will be reduced, while if the amount of the poor solvent (B) is greater than 40 parts by weight it will be difficult to achieve a uniform mixed solution, and therefore the proportions specified above are preferred. The good solvent in the homogeneous solution (A) and the poor solvent (B) may be each of a single type or a mixed solvent of 2 or more types.

For method (b), the homogeneous solution (A) of the polyimide precursor may be cast onto a substrate to make a solution film, and then this solution film may be immersed in a solidifying bath comprising the poor solvent (B) to precipitate a film-like product containing the poor solvent (B) and the film-like product drawn out from the solidifying bath to obtain a film-like composition (C).

In the third method described above as an example for fabrication of a porous insulating film, the non-solvent vapor exposure treatment may be accomplished by a technique such as a method in which a gas containing a non-solvent for the polyimide precursor, for example, an alcohol such as ethanol or methanol, or acetone, water or the like in the vapor phase is blown onto the surface of the polyimide precursor solution to incorporate the non-solvent vapor into the precursor solution, or a method in which the polyimide precursor solution is held for a prescribed period of time in a treatment tank filled with the above-mentioned vapor, or conveyed through it with a belt, for condensation of the non-solvent vapor on the precursor solution.

The non-solvent vapor exposure treatment step is preferably continued until condensation of about 0.1 mole or more of the non-solvent vapor per square meter of the precursor solution surface, in order to inhibit formation of a dense layer. There is no particular upper limit on the time for which the non-solvent vapor exposure treatment is continued, but it is preferably terminated just before the increasing amount of non-solvent condensing on the precursor solution surface causes precipitation of the precursor and clouding of the precursor solution, in order to obtain a homogeneous porous structure.

The temperature of the precursor solution during the non-solvent vapor exposure treatment step may be room temperature, but this is not a limitation so long as conditions are satisfied for condensation of the non-solvent vapor on the polyimide precursor solution surface.

The atmosphere of the precursor solution in the non-solvent vapor exposure treatment step may be atmospheric air, but this is also not a limitation so long as conditions are satisfied for condensation of the non-solvent vapor on the polyimide precursor solution surface.

The film of the polyimide precursor solution treated in the non-solvent vapor exposure treatment step is contacted with a solidifying solvent for precipitation of and pore formation in the polyimide precursor. The solidifying solvent for the polyimide precursor may be a non-solvent for the polyimide precursor, for example, an alcohol such as ethanol or methanol, or acetone, water or the like, or a mixture of 99.9-50 wt % of a non-solvent and 0.1-50 wt % of a solvent for the polyimide precursor.

As the method for casting a dope comprising a mixed solution of the polyimide precursor homogeneous solution (A) and the poor solvent (B) or the polyimide precursor homogeneous solution (A) onto the substrate to form a sheet in the aforementioned third method, there may be mentioned a method in which coating techniques employing spraying or doctor blade methods, or techniques of extrusion from a T-die or the like, and preferred is a method of casting onto a substrate of glass or the like or onto a movable belt substrate, or a method of extrusion of the polyimide precursor solution from a T-die.

The aforementioned dope solution for casting may also contain a surfactant, flame retardant or coloring agent, or reinforcing materials such as glass fibers, silicon-based fibers, inorganic powder and the like. Such additives and reinforcers may be added to the polyimide precursor homogeneous solution (A) or to the dope solution for casting.

The pore-formed polyimide precursor film as the film-like composition obtained by any of these three methods is then subjected to thermal imidation treatment or chemical imidation treatment. Thermal imidation of the polyimide precursor porous film is accomplished by fixing the polyimide precursor porous film using a pin, chuck or pinch roll in order to prevent its heat shrinkage, and subjecting it to a temperature of 280-500° C. in air for 5-60 minutes.

Chemical imidation treatment of the polyimide precursor porous film is accomplished by using an aliphatic acid anhydride or an aromatic acid anhydride as a dehydrating agent and a tertiary amine such as triethylamine as a catalyst. Imidazole or benzimidazole, or substituted derivatives thereof, may also be used as according to Japanese Unexamined Patent Publication No. 4-339835.

Chemical imidation treatment of the polyimide precursor porous film is preferably used for fabrication of a polyimide porous film with a multilayer construction. A multilayer polyimide porous film may be obtained, for example, by subjecting the surface of a polyolefin fine porous film used as the solvent substitution rate adjustor to plasma, electron beam or chemical treatment for modification of the interface adhesion with the polyimide porous layer, and then forming a multilayer structure with the cast polyimide precursor solution and contacting it with a solidifying solution to precipitate the cast polyimide precursor solution and form pores therein, to give a precursor porous film with a multilayer structure. Finally, with chemical imidation treatment it is possible to fabricate a multilayer polyimide porous film.

The porous polyimide film fabricated in this manner has a porosity of 15-80%, preferably 30-80% and especially 40-70%, and more preferably the mean pore size is 0.01-5 μm and especially 0.05-1 μm in the center and both surfaces, with a maximum pore size of no greater than 10 μm, although these will differ somewhat depending on the fabrication conditions that are selected. If the mean pore size is less than 0.01 μm it may be difficult to achieve a porosity of 15% or greater, and if the mean pore size is larger than 5 μm the insulating material may be undesirable in terms of precision in fine conformation working and bending.

The porous polyimide film may have either a single layer or multilayer construction, while the entire film is adjusted to a film thickness of 5-150 μm, preferably 5-125 μm and especially 5-100 μm, and the polyimide porous layer preferably has a heat resistance temperature of 200° C. or above and a heat shrinkage of no greater than ±1% when heat treatment is carried out for 8 hours at 105° C.

According to the invention, a substrate may be constructed containing a porous polyimide film which is a porous polyimide film obtained in the manner described above having a porosity of from 15 vol % to 80 vol %. This can give a low dielectric constant polyimide insulating film or substrate with a dielectric constant of no greater than 2.5. The porosity can also give a dielectric constant of less than 2 which cannot be realized with bulk plastics.

A porosity of less than 15 vol % results in a larger dielectric constant, and a porosity of greater than 80 vol % results in low strength of the substrate, and therefore neither situation is preferred.

According to the invention, electronic device substrate materials can be easily obtained having heat resistance temperatures of 200° C. or above. In such a construction, the presence of the space portion of the polyimide material containing gas with a much lower dielectric constant than the solid portion results in a film or substrate with a dielectric constant that is much lower than the polyimide bulk dielectric constant.

Since the porous polyimide film of the invention has nonlinear pore structure between one side and the other side even when in contact with a conductor, it is resistant to phenomena such as corona discharge, and is also resistant to dielectric deterioration due to dielectric breakdown and the like.

The porous polyimide film as the porous insulating material of the invention has a smooth surface and can also be used by mounting with lamination of one or a plurality of layers of the porous polyimide film, or a different dense polyimide film may be laminated with the porous polyimide film. For example, the porous polyimide film may be laminated onto an organic, inorganic or metal substrate such as a polyimide film, silicon substrate, glass substrate, carbon substrate or aluminum substrate, either directly or via a heat resistant adhesive.

In addition, a heat resistant, film-like adhesive layer such as a thermoplastic polyimide or polyimidosiloxane-epoxy resin may also be laminated on either or both sides of the porous polyimide film serving as the porous insulating material of the invention, and a protective film comprising a resin film of an aromatic polyimide, aromatic polyester, polyethylene, polypropylene, 1-polybutene, etc. may also be provided thereon to obtain the laminate.

This laminate prevents adhesion of dust and thus facilitates transport, and the protective film can be peeled off at the time of use and laminated onto a known conductive metal electronic circuit foil such as an electrolytic copper foil, rolled copper foil, rolled aluminum foil or the like to easily obtain a circuit substrate.

A heat resistant film-like adhesive layer may also be laminated onto either or both sides of the porous polyimide film serving as the porous insulating material of the invention, and a conductive metal electronic circuit foil laminated thereover to prepare the laminate.

Alternatively, the pore-formed polyimide precursor porous film may be combined with one side of the conductive metal electronic circuit foil and then heated to dryness for complete imidation to obtain the laminate.

Also, one side of a porous polyimide film serving as the porous insulating material of the invention may be combined with one side of a polyimide film, an inorganic substrate such as a silicon substrate, glass substrate or carbon substrate or a metal substrate such as an aluminum substrate, with a heat resistant film-like adhesive layer sandwiched between them, and then subjected to thermocompression bonding, after which the other side of the porous polyimide film serving as the porous insulating material of the laminate may be combined with a conductive metal foil with a heat resistant film-like adhesive layer sandwiched between them and then subjected to thermocompression bonding to obtain a laminated substrate as the laminate.

Also, an inorganic, organic or metal substrate such as a silicon substrate may be provided on one side of the porous polyimide film serving as the porous insulating material via a heat resistant adhesive and a dense polyimide layer on the other side either directly or via a heat resistant adhesive, with a conductive metal circuit layer further provided thereover, to prepare the laminate. In this case, a metal foil may be used as the conductive metal circuit layer.

Alternatively, a known metal such as copper, nickel, chromium, aluminum or the like may be used on one or both sides of the porous polyimide film serving as the porous insulating material to form a conductive metal circuit layer by a combination of vapor deposition (vacuum deposition or sputtering) and plating (electroless plating or electroplating).

The porous polyimide film serving as the porous insulating material of the invention may also be used after vacuum and/or heat drying to remove any moisture included in the continuous pores due to the surroundings.

The porous insulating film having a mean pore size of 0.01-5 μm, a porosity of 30-80%, a maximum pore size of no greater than 10 μm, a film thickness of 5-100 μm, a resistance to passage of air of from 30 sec/100 cc to 2000 sec/100 cc, a heat resistance temperature of 200° C. or above and a heat shrinkage of no greater than ±1%, with fine continuous pores reaching to both surfaces, exhibits satisfactory heat resistance and electrical insulating properties as well as ion mobility, and is therefore suitable for such uses as battery separators and the like.

Examples of the invention will now be provided.
The measurement methods used are explained below.
(1) Porosity
The film thickness and weight of a porous film cut to a prescribed size were measured, and the porosity was calculated based on the weight according to the equation given below. In this equation, S is the porous film area, d is the film thickness, W is the measured weight and D is the polyimide density; the polyimide density was assumed to be 1.34 g/m³.

Porosity (%)=100−100×(W/D)/(S×d)

(2) Dense layer thickness, proportion
A cross-section was cut out of the porous film, the dense layer thickness and entire film thickness were measured with a scanning microscope, and the dense layer proportion was calculated.

(3) Pore size
A cross-section was cut out of the porous film and measured with a scanning electron microscope at the center and surfaces of the porous film.

(4) Dielectric constant
This was measured at a frequency of 1000 Hz, according to JIS-C-6481.

(5) Tensile strength
This was measured according to JIS K7127. A Tensilon Universal Tester (product of Toyo Baldwin Co.) was used for measurement at a strain rate of 10 mm/min.

(6) Shrinkage factor
A sample with graduated markings of a specified length was allowed to stand in an unbound condition for 8 hours in an oven set to 105° C., and after being removed its dimensions were measured. The heat shrinkage factor was determined by the equation given below. In the equation, $L_1$ represents the film dimensions after being removed from the oven, and $L_0$ represents the initial film dimensions.

Heat shrinkage factor (%)=[1−($L_1$/$L_0$)]=100

(7) Penetrating strength
A sample was fixed in a round-hole holder with a diameter of 11.28 mm and a surface area of 1 cm², and then a 1 mm diameter needle with a point shape of 0.5 R was lowered at a speed of 2 mm/sec until penetration and the penetration load was measured.

(8) Heat resistance temperature
A nonaqueous electrolyte solution was filled into the fine pores and the temperature dependence of the electrical resistance was measured using a measuring device by Hioki E.E. Corp. (3520 LCR HiTESTER), while the porous film structure was observed to determine whether or not a deformation occurred, and the highest temperature at which no such problems were observed was recorded as the heat resistance temperature.

(9) Resistance to passage of air
This was measured using a Gurley densometer according to JIS-P-8117.

EXAMPLE 1

Using s-BPDA as the tetracarboxylic acid component and DADE as the diamine component, these were dissolved in NMP with the DADE at a molar ratio of 0.994 with respect to the s-BPDA and the monomer components at a total weight of 10 wt %, and was polymerized at a temperature of 40° C. for 6 hours to obtain a polyimide precursor. The solution viscosity of the polyimide precursor solution was 500 poises.

The resulting polyimide precursor solution was cast onto a glass substrate to a thickness of about 75 μm, and then the surface thereof was covered with a polyolefin fine porous film (product of Ube Kosan, KK.) having a resistance to passage of air of 550 sec/100 cc as a solvent substitution rate adjustor, without producing wrinkles. The laminate was immersed in methanol for 5 minutes and subjected to solvent substitution with the solvent substitution rate adjustor for precipitation of and pore formation in the polyimide precursor.

The precipitated polyimide precursor porous film was immersed in water for 15 minutes and then released from the glass substrate and solvent substitution rate adjustor and affixed to a pin tenter for heat treatment in air at 300° C. for 10 minutes, to obtain a porous polyimide film.

Figure 7:
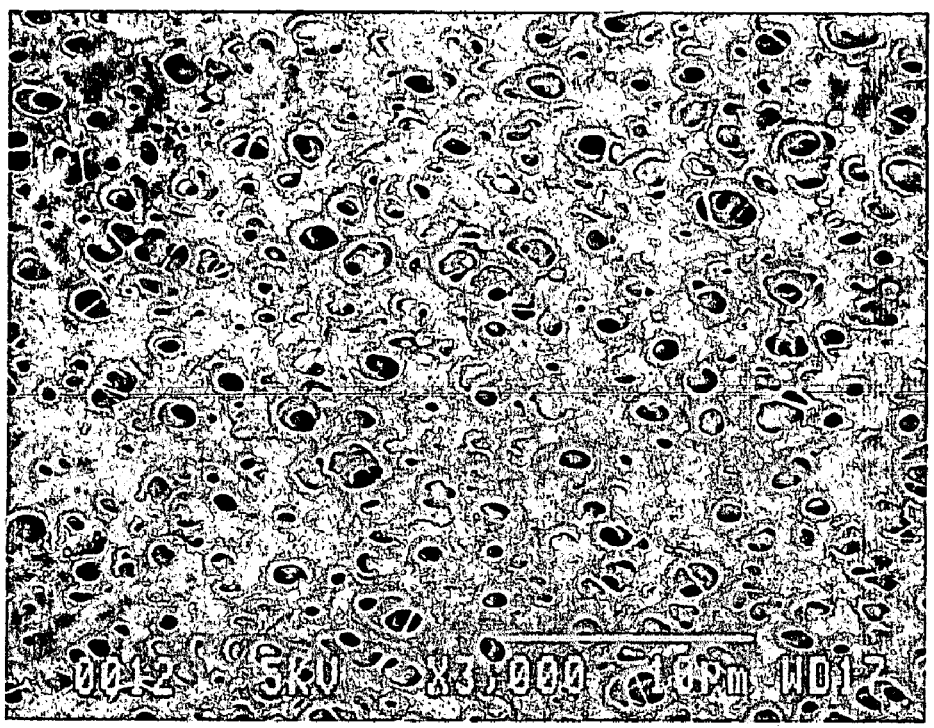
FIG. 7 is a scanning electron microscope photograph of the surface of a porous polyimide film as the porous insulating material obtained in Example 1.
Figure 8:
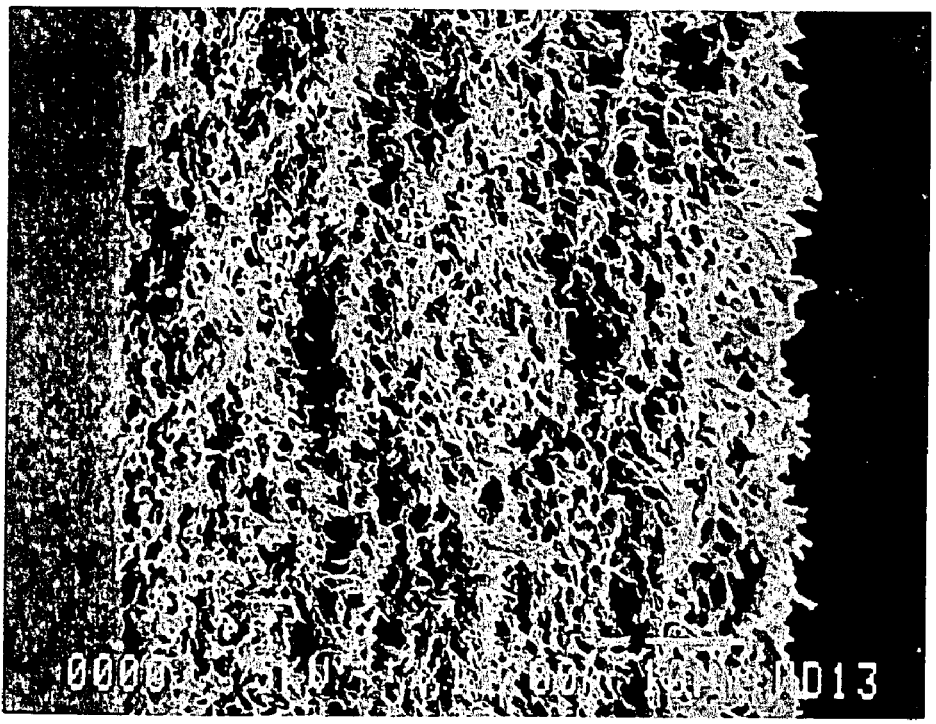
FIG. 8 is a scanning electron microscope photograph of a cross-section of a porous polyimide film as the porous insulating material obtained in Example 1.
Figure 9:
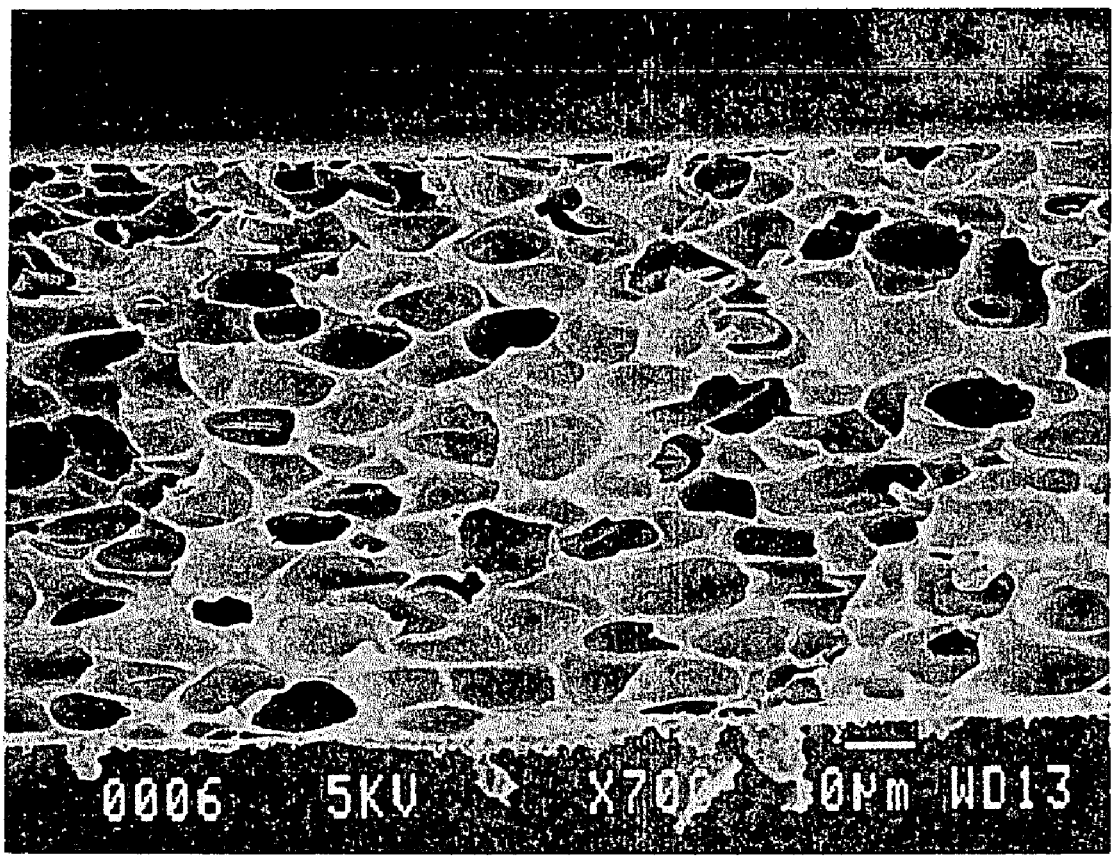
FIG. 9 is a scanning electron microscope photograph of a cross-section of a both side-densified porous polyimide film according to an embodiment of the invention.

The resulting porous polyimide film was observed with a scanning electron microscope and found to have fine curved continuous pores, a thickness of 40 µm, an average pore size of 0.5 µm and a maximum pore size of no greater than 10 µm on the surface, an average pore size in the range of 0.01-2 µm and a maximum pore size of no greater than 10 µm at the center, a porosity of 60%, a resistance to passage of air of 180 sec/100 cc, a penetrating strength of 350 gf, a heat shrinkage of 0.4% and a heat resistance temperature of 200° C. or above. Scanning electron microscope photographs are shown in FIGS. 7 and 8.

EXAMPLE 2

Using s-BPDA as the tetracarboxylic acid component and p-PDA as the diamine component, these were dissolved in NMP with the p-PDA at a molar ratio of 0.994 with respect to the s-BPDA and the monomer components at a total weight of 15 wt %, and polymerization was conducted at a temperature of 40° C. for 6 hours to obtain a polyimide precursor. The solution viscosity of the polyimide precursor solution was 500 poise.

The resulting polyimide precursor solution was cast onto a glass substrate to a thickness of about 150 µm, and then the surface thereof was covered with a polyolefin fine porous film (product of Ube Kosan, KK.) having a gas permeability of 550 sec/100 cc as a solvent substitution rate adjustor, without producing wrinkles. The laminate was immersed in methanol for 5 minutes and subjected to solvent substitution with the solvent substitution rate adjustor for precipitation of and pore formation in the polyimide precursor.

The precipitated polyimide precursor porous film was immersed in water for 15 minutes and then released from the glass substrate and solvent substitution rate adjustor and affixed to a pin tenter for heat treatment in air at 400° C. for 10 minutes, to obtain a porous polyimide film.

Observation with a scanning electron microscope revealed fine curved continuous pores, a thickness of 50 µm, an average pore size of 0.5 µm and a maximum pore size of no greater than 10 µm on the surface, an average pore size in the range of 0.01-2 µm and a maximum pore size of no greater than 10 µm at the center, a porosity of 60%, a gas permeability of 380 sec/100 cc, a penetrating strength of 520 gf, a heat shrinkage of 0.3% and a heat resistance temperature of 200° C. or above.

EXAMPLE 3

Using s-BPDA as the tetracarboxylic acid component and a preparation of p-PDA and DADE in a molar ratio of 85:15 as the diamine component, these were dissolved in NMP with the diamine component at a molar ratio of 0.994 with respect to the s-BPDA and the monomer components at a total weight of 15 wt %, and was polymerized at a temperature of 40° C. for 6 hours to obtain a polyimide precursor. The solution viscosity of the polyimide precursor solution was 600 poises.

The resulting polyimide precursor solution was cast onto a glass substrate to a thickness of about 150 µm, and then the surface thereof was covered with a polyolefin fine porous film (product of Ube Kosan, KK.) having a resistance to passage of air of 550 sec/100 cc as a solvent substitution rate adjustor, without producing wrinkles. The laminate was immersed in methanol for 5 minutes and subjected to solvent substitution with the solvent substitution rate adjustor for precipitation of and pore formation in the polyimide precursor.

The porous polyimide precursor film was immersed in water for 15 minutes and then released from the glass substrate and solvent substitution rate adjustor and affixed to a pin tenter for heat treatment in air at 330° C. for 10 minutes, to obtain a porous polyimide film.

Observation with a scanning electron microscope revealed fine curved continuous pores, a thickness of 65 µm, an average pore size of 0.9 µm and a maximum pore size of no greater than 10 µm on the surface, an average pore size in the range of 0.01-2 µm and a maximum pore size of no greater than 10 µm at the center, a porosity of 63%, a resistance to passage of air of 580 sec/100 cc, a penetrating strength of 860 gf, a heat shrinkage of 0.2% and a heat resistance temperature of 200° C. or above.

EXAMPLE 4

A porous polyimide film was obtained in the same manner as Example 1, except that the thickness of the cast polyimide precursor solution in Example 1 was changed to about 150 µm.

Observation with a scanning electron microscope revealed fine curved continuous pores, a thickness of 84 µm, an average pore size of 0.4 µm and a maximum pore size of no greater than 10 µm on the surface, an average pore size in the range of 0.01-2 µm and a maximum pore size of no greater than 10 µm at the center, a porosity of 60%, a resistance to passage of air of 270 sec/100 cc, a penetrating strength of 440 gf, a heat shrinkage of 0.3% and a heat resistance temperature of 200° C. or above.

The dielectric constant ($\epsilon$) and dielectric loss tangent ($\tan\delta$) of the porous polyimide film were measured under the conditions described below. The measuring electrode was 200 nm, 8 mm aluminum, the measuring apparatus was a Hewlett-Packard 4194A, the measuring frequency range was from 1 kHz to 10 MHz, and the average value of 16 measurements for each measuring point was used. The measuring temperature was 25° C. The measuring results for the measuring frequencies of 1000 Hz and 10 MHz are given below. The dielectric constant was virtually unchanged within this measuring range.

1000 Hz
 Dielectric constant: 1.68
 Loss tangent: 0.0025

10 MHz
 Dielectric constant: 1.67
 Loss tangent: 0.0053

The dielectric constant of the dense polyimide (bulk polyimide) was 3.2 to 3.4 at each frequency, indicating the properties of the porous polyimide film of the invention.

EXAMPLE 5

A porous polyimide film was obtained in the same manner as Example 2, except that the thickness of the cast polyimide precursor solution was changed to about 200 µm.

Observation with a scanning electron microscope revealed fine nonlinear pores, a thickness of 62 µm, an average pore size of 0.7 µm and a maximum pore size of no greater than 10 µm on the surface, an average pore size in the range of 0.01-2 µm and a maximum pore size of no greater than 10 µm at the center, a porosity of 64% and a heat resistance temperature of 200° C. or above.

The dielectric constant (ε) and dielectric loss tangent (tanδ) were as shown below. The dielectric constant was virtually unchanged within the measuring range.

1000 Hz
  Dielectric constant: 1.73
  Loss tangent: 0.0029
10 MHz
  Dielectric constant: 1.71
  Loss tangent: 0.0062

EXAMPLE 6

A porous polyimide film was obtained in the same manner as Example 3, except that the thickness of the cast polyimide precursor solution was changed to about 150 µm.

Observation with a scanning electron microscope revealed fine nonlinear continuous pores, a thickness of 51 µm, an average pore size of 0.9 µm and a maximum pore size of no greater than 10 µm on the surface, an average pore size in the range of 0.01-2 µm and a maximum pore size of no greater than 10 µm at the center, a porosity of 43% and a heat resistance temperature of 200° C. or above.

The dielectric constant (ε) and dielectric loss tangent (tanδ) were as shown below.

The dielectric constant was virtually unchanged within the measuring range.

1000 Hz
  Dielectric constant: 2.34
  Loss tangent: 0.0032
10 MHz
  Dielectric constant: 2.31
  Loss tangent: 0.0055

Since dropping methanol onto one side of the porous polyimide films obtained in Examples 1-6 and allowing it to remain resulted in wetting of the other side, the formation of continuous pores was confirmed. Separately there were fabricated a dense polyimide film and an independent pore polyimide film, and dropping of methanol in the same manner resulted in no wetting of the other side.

EXAMPLE 7

Each of the porous polyimide films obtained in Examples 4, 5 and 6 and an electrolytic copper foil (35 µm) or rolled copper foil (10 µm) were combined using a 20-µm thick film-like polyimidosiloxane-epoxy resin-based thermosetting heat resistant adhesive (UPA, product of Ube Kousan, KK.), and these were subjected to heat treatment under a nitrogen gas stream at 100° C. for one hour, 120° C. for one hour and 180° C. for 5 hours to harden the adhesive and obtain a firmly adhered laminate substrate. The adhesive strength was at least 1.0 kg/cm for all the films.

The dielectric constant values for separately prepared laminates of porous polyimide films and the adhesive were as follows.

1000 Hz
  Dielectric constant: 1.8, 1.8 and 2.4
10 MHz
  Dielectric constant: 1.8, 1.8 and 2.4

EXAMPLE 8

Using s-BPDA as the tetracarboxylic acid component and DADE as the diamine component, these were dissolved in NMP (bp: 202° C.) with the DADE at a molar ratio of 0.994 with respect to the s-BPDA and the monomer components at a total weight of 18 wt %, and polymerization was conducted at a temperature of 40° C. for 6 hours to obtain a homogeneous solution (A) of the polyimide precursor.

Next, n-decanol (bp: 231° C.) was added as a poor solvent (B) to the homogeneous solution (A) of the polyimide precursor, to obtain a dope solution containing the polyimide precursor at about 15 wt %, NMP at 68 wt % and n-decanol at 17 wt %.

The solution was cast onto a glass substrate to a thickness of about 150 µm and dried at about 80° C. The polyimide precursor film (polyimide precursor gel) that separated from the glass substrate at the start of drying was affixed to a pin tenter for heat treatment in air at 300° C. for 40 minutes, to obtain a porous polyimide film.

A cross section of the resulting porous polyimide film was observed with a scanning microscope, and both surface layers were confirmed to be dense layers with fine curved continuous pores at the center in the cross-sectional direction of the film. Measurement of the tensile strength, film thickness, porosity, surface condition, dense layer thickness, center condition, heat shrinkage ratio and penetrating strength of the porous polyimide film gave the following results.

Evaluation Results
  Tensile strength: 460 kgf/cm$^2$
  Film thickness: 85 µm
  Porosity: 65%
  Surface condition: dense layer
  Dense layer thickness: 2.1 µm (both sides)
  Center condition: Porous layer: mean pore size in range of 0.01-2 µm, maximum pore size of 10 µm
  Heat shrinkage: 0.3%
  Penetrating strength: 385 gf

EXAMPLE 9

A porous polyimide film was obtained in the same manner as Example 8, except that ethyleneglycol (bp: 197.8° C.) was added to the homogeneous solution (A) of the polyimide precursor as the poor solvent (B) instead of n-decanol, and a dope solution prepared with the polyimide precursor at about 10 wt %, NMP at 48 wt % and ethyleneglycol at 42 wt % was used.

A cross-section of the resulting porous polyimide film was observed with a scanning microscope, and revealed to have the same structure and tensile strength as the film of Example 8. Measurement of the film thickness, porosity, surface condition, dense layer thickness, center condition, heat shrinkage ratio and penetrating strength gave the following results.

Evaluation Results
  Film thickness: 83 µm
  Porosity: 52%
  Surface condition: dense layer
  Dense layer thickness: 3.0 µm (both sides)
  Center condition: Porous layer: mean pore size in range of 0.01-2 µm, maximum pore size of 10 µm
  Heat shrinkage: 0.3%
  Penetrating strength: 408 gf

EXAMPLE 10

Using ethyleneglycol (bp: 197.8° C.) as the poor solvent (B), a homogeneous solution (A) of the polyimide precursor was cast onto a glass substrate to make a solution film, which was then immersed into an ethyleneglycol solidifying bath together with the glass substrate to precipitate a film, and the precipitated film was removed from the solidifying bath and affixed to a pin tenter for immediate heating at 300° C. for 40 minutes for imidation to obtain a porous polyimide film.

A cross section of the resulting porous polyimide film was observed with a scanning microscope, and revealed to have the same structure and tensile strength as the film of Example 8.

Measurement of the film thickness, porosity, surface condition, dense layer thickness, center condition, heat shrinkage ratio and penetrating strength gave the following results.

Evaluation Results
Film thickness: 84 µm
Porosity: 49%
Surface condition: dense layer
Dense layer thickness: 1.8 µm (both sides)
Center condition: Porous layer: mean pore size in range of 0.01-2 µm, maximum pore size of 10 µm
Heat shrinkage: 0.3%
Penetrating strength: 410 gf

COMPARATIVE EXAMPLES 1 AND 2

The same procedure was followed as in Example 8, except that ethanol (bp: 78.3° C.) was used (Comparative Example 1) or methanol (bp: 64.1° C.) was used (Comparative Example 2) as the poor solvent (B) instead of n-decanol. Observation of cross-sections of the resulting polyimide films with a scanning microscope revealed that both were films of only a dense layer with no porous layer.

EXAMPLE 11

A porous polyimide film was obtained by the same procedure as in Example 8, except that the homogeneous solution (A) of the polyimide precursor was obtained using PPD as the diamine component instead of DADE, and the heating temperature (maximum temperature) was changed to 425° C. The evaluation results for the porous polyimide film were the same as in Example 8.

EXAMPLE 12

The porous polyimide films obtained in Examples 8-10 were used for evaluation as insulating materials. All exhibited satisfactory properties. The porous polyimide film obtained in Example 8 had a dielectric constant of 2.1 at 23° C., 1000 Hz and a dielectric loss of 0.004.

Cross sections of each of the porous polyimide films obtained in the examples (Examples 1-11) were observed under a scanning microscope and found to be smooth on both surfaces.

COMPARATIVE EXAMPLE 3

A commercially available non-porous polyimide film with a thickness of 25 µm was used for evaluation. It had a dielectric constant of 3.2 at 23° C., 1000 Hz and a dielectric loss of 0.004, and therefore the dielectric constant was inadequate.

The present invention, having the construction described above, thus exhibits the following effects.

According to the invention it is possible to obtain a porous insulating material with low dielectric constant that cannot be achieved with bulk polyimides, as well as heat resistance and strong adhesion or adhesion with metals and metal foils.

What is claimed is:

1. A porous insulating film consisting essentially of a highly heat resistant polyimide resin film having a fine porous structure wherein:
   a) fine continuous channels reaching to both surfaces of the insulating film in a nonlinear fashion have a mean pore size of 0.01-0.2 µm in the center of the film and 0.4-0.9 µm at both surfaces of the film and a porosity of 15-80%;
   b) the polyimide resin film is prepared from a polyimide precursor solution and consists essentially of a polyimide obtained from the combination of at least one tetracarboxylic acid component and a diamine component; and
   c) the insulating film has
      a thickness of 5-150 µm,
      a resistance to passage of air of from 30 sec/100 cc to 2000 sec/100 cc,
      and
      a heat shrinkage of not greater than about ±1% after being heat-treated at 105° C. for 8 hours, and
      does not contain a dense layer on either of the surfaces.

2. The porous insulating film according to claim 1, wherein the porosity is 30-80%.

3. The porous insulating film according to claim 1, wherein the thickness is 5-100 µm.

4. The porous insulating film according to claim 1, which is fabricated by a film casting method.

5. The porous insulating film according to claim 1, which has a dielectric constant of no greater than 2.5.

6. The porous insulating film according to claim 1, wherein the pores in the porous structure are arranged in the film substantially parallel to the film surfaces.

7. A porous insulating film consisting essentially of a highly heat resistant polyimide resin film having a fine porous structure wherein:
   a) fine continuous channels reaching to both surfaces of the insulating film in a nonlinear fashion have a mean pore size of 0.01-0.2 µm in the center of the film and 0.4-0.9 µm at both surfaces of the film; and
   b) the polyimide resin film is prepared from a polyimide precursor solution and consists essentially of a polyimide obtained from the combination of at least one tetracarboxylic acid component and a diamine component; and
   c) the insulating film has
      a thickness of 5-100 µm,
      a resistance to passage of air of from 30 sec/100 cc to 2000 sec/100 cc,
      a heat resistance temperature of at least 200° C., and
      a heat shrinkage of not greater than ±1% after being heat-treated at 105° C. for 8 hours, and
      does not contain a dense layer on either of the surfaces.

8. A battery separator comprising a porous insulating film according to claim 7.

9. The porous insulating film according to claim 7, wherein the pores in the porous structure are arranged in the film substantially parallel to the film surfaces.

10. The porous insulating film according to claim 1 or 7, wherein the tetracarboxylic acid component is selected from a biphenyltetracarboxylic dianhydride, pyromellitic dianhydride and a benzophenonetetracarboxylic dianhydride.

11. The porous insulating film according to claim 10, wherein the biphenyltetracarboxylic dianhydride is 3,3',4,4'-biphenyltetracarboxylic dianhydride.

12. The porous insulating film according to claim 1 or 7, wherein the diamine component is selected from a phenylenediamine or a diaminodiphenylether.

* * * * *